United States Patent
Brunco et al.

(10) Patent No.: US 8,207,030 B2
(45) Date of Patent: Jun. 26, 2012

(54) METHOD FOR PRODUCING NMOS AND PMOS DEVICES IN CMOS PROCESSING

(75) Inventors: David Paul Brunco, Hillsboro, OR (US); Brice De Jaeger, Leuven (BE); Simone Severi, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/431,618

(22) Filed: Apr. 28, 2009

(65) Prior Publication Data

US 2009/0272976 A1 Nov. 5, 2009

(30) Foreign Application Priority Data

Apr. 30, 2008 (EP) .................................... 08155510

(51) Int. Cl.
*H01L 21/8238* (2006.01)
(52) U.S. Cl. ........ 438/199; 438/217; 438/218; 438/229; 438/230; 438/231; 438/232; 438/275; 438/276; 257/288; 257/327; 257/344; 257/346; 257/368; 257/369; 257/408
(58) Field of Classification Search .................. 438/199, 438/217, 218, 229–232, 275–276; 257/288, 257/327, 344, 346, 368–369, 408
See application file for complete search history.

(56) References Cited

U.S. PATENT DOCUMENTS

| | | | | |
|---|---|---|---|---|
| 5,561,072 A * | 10/1996 | Saito | ............................ | 438/513 |
| 7,560,319 B2 * | 7/2009 | Kang et al. | .................... | 438/154 |
| 2006/0157797 A1 * | 7/2006 | Tateshita | ........................ | 257/369 |
| 2006/0220114 A1 * | 10/2006 | Miyashita et al. | ............ | 257/335 |
| 2006/0258073 A1 * | 11/2006 | Greene et al. | .................. | 438/199 |
| 2008/0023692 A1 * | 1/2008 | Wirbeleit et al. | ............... | 257/19 |
| 2008/0099794 A1 * | 5/2008 | Beyer et al. | ..................... | 257/255 |
| 2008/0268587 A1 * | 10/2008 | Sadaka et al. | ................. | 438/199 |
| 2009/0227078 A1 * | 9/2009 | Chen et al. | .................... | 438/199 |
| 2009/0246922 A1 * | 10/2009 | Wu et al. | ....................... | 438/231 |

OTHER PUBLICATIONS

Brunco et al., Germanium: The Past and Possibly a Future Material for Microelectronics, ECS Trans 11 (4), 479 (2007).

Chao et al., Preamorphization implantation-assisted boron activation in bulk germanium and germanium-on-insulator, Applied Physics Letters, AIP, Sep. 2005, vol. 87, No. 14, pp. 142102-142102, New York.

Haynes et al., Composition dependence of solid-phase epitaxy in silicon-germanium alloys: Experiment and theory, Physical Review B, Mar. 15, 1995, vol. 51, No. 12, 7762-7771.

Jia Feng et al., Integration of Germanium-on-Insulator and Silicon MOSFETs on a Silicon Substrate, *IEEE Elect. Dev. Lett.* 27 911 (2006).

(Continued)

*Primary Examiner* — Bac Au
(74) *Attorney, Agent, or Firm* — Knobbe Martens Olson & Bear LLP

(57) ABSTRACT

A method for producing one or more nMOSFET devices and one or more pMOSFET devices on the same semiconductor substrate is disclosed. In one aspect, the method relates to the use of a single activation anneal that serves for both Si nMOS and Ge pMOS. By use of a solid phase epitaxial regrowth (SPER) process for the Si nMOS, the thermal budget for the Si nMOS can be lowered to be compatible with Ge pMOS.

18 Claims, 1 Drawing Sheet

OTHER PUBLICATIONS

Kim et al., Advanced source/drain engineering for box-shaped ultrashallow junction formation using laser annealing and pre-amorphization implantation in sub-100-nm SOI CMOS, IEEE Transaction on Electron Devices, Oct. 2002, vol. 49, No. 10, IEEE Service Center, New Jersey.

Olson et al., Kinetics of Solid Phase Crystallization in Amorphous Silicon, Materials Science Reports 3, (1988), 1-78.

Ragnarsson et al., High Performing 8 A EOT HfO2 / TaN Low Thermal-Budget n-channel FETs with Solid-Phase Epitaxially Regrown (SPER) Junctions, VLSI Technology, Jun. 2005, Digest of Technical Papers, pp. 234-235, 2005 Symposium on Kyoto, Japan.

Schade, K., Halbleitertechnolgie, Halbleiter-Technologie, Teubner, Stuttgart, Germany, vol. 2, Jan. 1983, pp. 93-96, XP002415170.

Shang et al., Selectively Formed High Mobility Strained Ge PMOSFETs for High Performance CMOS, Electron Devices Meeting, Dec. 2004, IEDM Technical Digest, IEEE International, California, pp. 157-160.

Weber, Etude, Fabrication Et Proprietes De Transport De Transistors Cmos Associant Un Dielectrique Haute Permittivite Et Un Canal De Conduction Haute Mobilite, Phd Thesis, Cea-Leti and Insa De Lyon (2005).

Weber et al., Strained Si and Ge MOSFETs with High-K/Metal Gate Stack for High Mobility Dual Channel CMOS, Electron Devices Meeting 2005, IEDM Technical Digest, IEEE, XP010903419.

European Search Report mailed Oct. 8, 2008 for EP Application No. 08155510.4.

* cited by examiner

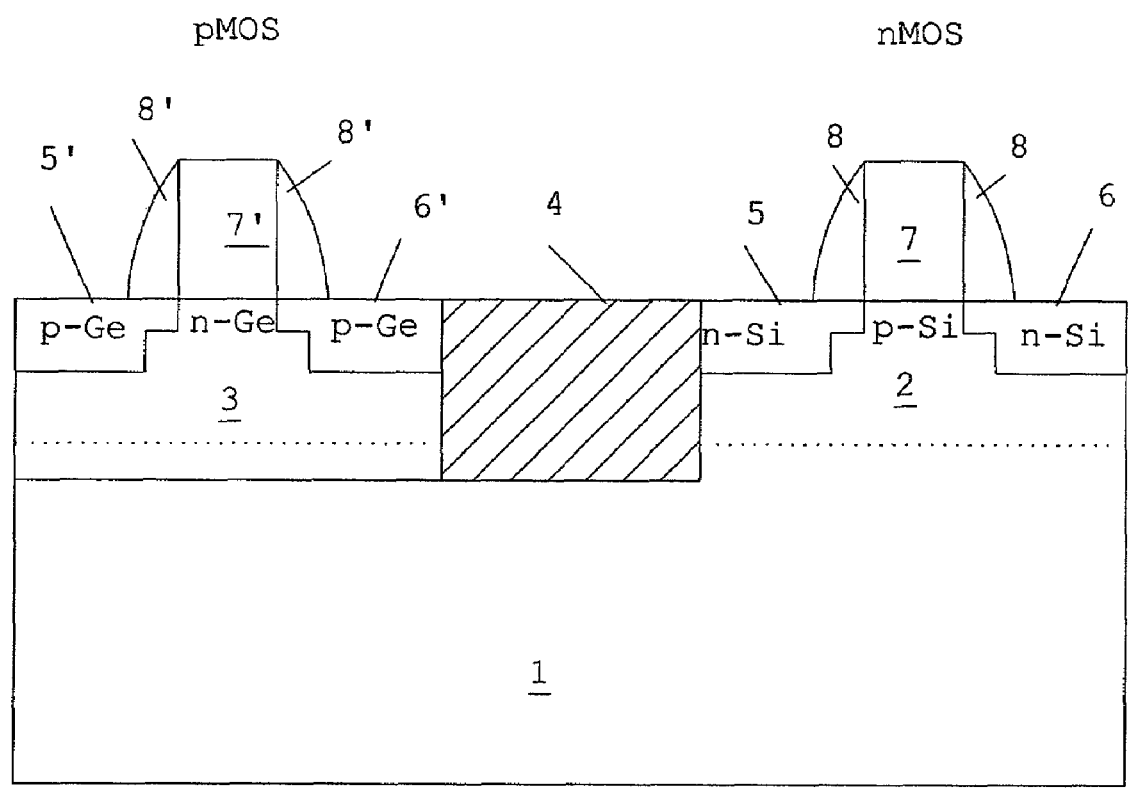

METHOD FOR PRODUCING NMOS AND PMOS DEVICES IN CMOS PROCESSING

BACKGROUND OF THE INVENTION

1. Field of the Invention

The present invention is related to a method for integrating CMOS devices on a semiconductor substrate.

2. Description of the Related Technology

Integrated CMOS processing involves the production of pMOSFET and nMOSFET devices (hereafter generally called 'pMOS' and 'nMOS') on a semiconductor substrate. Current research has revealed promising results for Ge pMOS devices, i.e. p-channel MOSFET transistors produced in a layer of Ge, whereas Ge nMOS devices have shown inferior performance. It is advantageous therefore to combine Si nMOS with Ge pMOS, but present research has encountered a number of technical difficulties in this area. Standard dopant activation anneals for Si are performed at temperatures typically higher than 1000° C. for high performance logic. However, the melting temperature of Ge is 937° C. Consequently, with a conventional process flow, the Si nMOS needs to be fabricated through dopant activation prior to depositing Ge. Essentially the entire front end process flow needs to be repeated for the Ge pMOS, with the associated increase in fabrication cost and the risk of adversely affecting the existing Si nMOS. Lowering the anneal temperature and annealing for longer times would be an option, but for short channel devices (channel width <~0.5 µm) such a cooler, longer anneal would result in low dopant activation and an excessive diffusion of dopants in the tail of the junction profile. This makes it difficult to produce short channel Ge pMOS and Si nMOS in one process flow, while controlling dopant activation and diffusion.

The document "Integration of Germanium-on-Insulator and Silicon MOSFETs on a Silicon Substrate", Jia Feng et al, *IEEE Elect. Dev. Lett.* 27 911 (2006) describes a CMOS flow with Si nMOS and Ge pMOS. They report fabricating the Si nMOSFET using a conventional activation anneal (1050° C. RTP), then depositing the Ge and fabricating the Ge pMOSFET.

The document "Strained Si and Ge MOSFETs with High-K/Metal Gate Stack for High Mobility Dual Channel CMOS", O. Weber et al, *IEEE IEDM Tech Dig,* 137 (2005) discusses CMOS, but actually describes fabrication of nMOS and pMOS on separate samples. For the CMOS emulation, a 600° C. activation anneal is done for Ge and Si. However, Weber et al. only present long channel (10 µm) device results for Si, and no indication is given as to how the method can be scaled to short channel devices. In fact, there is no indication of Ge implantation, as an amorphization process, for NMOS devices. Such an amorphization process is essential for allowing deep short channel transistor scaling with a low thermal budget. An anneal time of 15 min is specified for this work in "Etude, Fabrication et Propriétés de Transport de Transistors CMOS associant un Diélectrique Haute Permittivité et un Canal de Conduction Haute Mobilité", O. Weber, PhD Thesis, CEA-LETI and INSA de Lyon (2005).

It is thus desirable to have an improved method for integrating Ge pMOS and Si nMOS devices in CMOS processing.

SUMMARY OF CERTAIN INVENTIVE ASPECTS

One inventive aspect is related to a method as disclosed in the appended claims. Preferred embodiments are disclosed in combinations of the independent claim with one or more dependent claims.

In particular, one inventive aspect is related to a method for producing one or more nMOSFET devices and one or more pMOSFET devices on the same semiconductor substrate. The method comprises creating at least one crystalline Si active area and at least one crystalline Ge active area on the substrate, the active areas being separated by insulator areas; forming a gate on the Si active area and a gate on the Ge active area; after formation of the gates, implanting the Ge and Si areas with dopants to form source and drain regions; activating the dopants, wherein after gate formation, and prior to the implantation process, at least the crystalline Si active area is subjected to an amorphization process, so as to form an amorphous Si layer on top of a crystalline Si layer, wherein activation of dopants in the amorphous Si layer takes place by a process of activation-annealing the substrate at a temperature and during a time interval suitable for obtaining Solid Phase Epitaxial Regrowth of the amorphous layer, wherein activation of dopants in the Ge area takes place by the same activation-annealing process.

The process of implanting the Ge and Si areas with dopants to form source and drain regions is typically done by applying the following processes in the Si active area and, in the Ge active area, respectively: (a) a first implantation process to form halo and extension areas in the Si, respectively, Ge area not covered by the gate stack, followed by (b) formation of spacers on both sides of the gate, followed by (c) a second implantation process to form highly doped areas in the Si, respectively Ge area not covered by the gate stack and spacers, having a higher dopant density than the halo/extension areas.

The amorphization process may take place by implanting the Si active area with Si ions, Ge ions, or impurity ions.

The Ge active area may be implanted with the ions in the same implanting process, so as to obtain an amorphous Ge layer, on top of a crystalline Ge layer.

The activation-annealing process may take place at a temperature between about 500° C. and 900° C., more preferably between about 550° C. and 700° C. Even more preferably, the activation-annealing process takes place at a temperature between about 600° C. and 900° C., and during a time interval of less than about 5 minutes.

The Si active area may include or consist of one or more layers of $Si_xGe_{1-x}$, with x>about 80%. The Ge active area may include or consist of one or more layers of $Si_yGe_{1-y}$, with y<about 20%.

One inventive aspect utilizes a single activation anneal that serves for both Si nMOS and Ge pMOS. By use of a solid phase epitaxial regrowth (SPER) process for Si nMOS, the thermal budget for the Si nMOS can be lowered to be compatible with Ge pMOS. Activation of Ge n-type dopants and reasonable SPER rates for Si provide a practical lower limit on temperature of about 500° C. and the melting of Ge provides an upper limit of about 937° C. According to the preferred embodiment, an activation anneal temperature is applied between about 500 and 900° C., more preferably between about 550 and 700° C. Within these temperature ranges, times that are sufficient to crystallize the Si are sufficient to activate the dopants in Ge.

BRIEF DESCRIPTION OF THE DRAWINGS

FIG. 1 illustrates a device structure to which the method of one embodiment is applicable.

DETAILED DESCRIPTION OF CERTAIN ILLUSTRATIVE EMBODIMENTS

FIG. 1 shows schematically a CMOS structure comprising a Ge pMOS and Si nMOS device. In a Si substrate 1, a Si active area 2 is provided, and a Ge active area 3. The active areas are separated and insulated from each other by area 4, which may include or consist of $SiO_2$. In the following detailed description and in the appended claims, the terms 'Si active area' or 'Si layer' is to be understood as areas including or consisting mainly of Si. A Si active area may for example include or consist of one or more stacked layers of $Si_xGe_{1-x}$, with x>about 80%. Likewise, a 'Ge active area' is to be understood as an area comprising one or more stacked layers of $Si_yGe_{1-y}$, with y<about 20%. For simplicity's sake, the terms 'Si' and 'Ge' are used in the remainder of this description.

The Si-area 2 comprises a Si p-well, delimited by the dotted line, and the Ge-area 3 likewise comprises a Ge n-well (delimited by the dotted line). These wells may be formed, for example, by a doping implantation process and/or during a doped selective epitaxial growth of all or part of areas 2 and/or 3, prior to the gate formation. Gate stacks 7,7' and spacers 8,8' are present both in the nMOS and the pMOS devices. Gate stacks 7, 7" are hereafter called 'gates', while the expression 'gate stack' is reserved for the stack of layers formed before formation of the gate by etching the gate stack. The n-doped regions 5,6 are the source and drain of the nMOS device, whereas the p-doped regions 5',6' are the source and drain of the pMOS device. These source and drain regions are typically formed by implantation processes which take place after the formation of the gate, in order to form the typical junction profiles (Highly doped drain (HDD), Lowly doped drain (LDD), halos). Such implantation to form source and drain areas can take place by applying the following processes in the Si active area and, separately, in the Ge active area:

a first implantation process to form halo and extension areas in the Si, respectively, Ge area not covered by the gate stack, followed by formation of spacers (8) on both sides of the gate, followed by a second implantation process to form highly doped areas in the Si, respectively Ge area not covered by the gate stack and spacers, having a higher dopant density than the halo/extension areas These dopants need to be activated by an anneal process. In one embodiment, the dopant activation takes place simultaneously in the Si and Ge active areas, by an anneal process which activates the dopants in the Si-active area through Solid Phase Epitaxial Regrowth (SPER) of an amorphous Si layer. The anneal may take place at temperatures of around 600° C., and in any case below the melting temperature of Ge, so that activation of the dopants in the Ge-active area is performed without danger of melting the Ge.

To obtain the amorphous Si layer, the Si-active area is subjected to an amorphization process, after formation of the gate 7 (and before spacer formation, and before the first implantation process forming the extension and/or halo regions). The amorphization process can be performed prior to the doping implant applied for forming source and drain areas (5,6).

When performed as a separate process, amorphization of a crystalline Si-layer may be obtained by implanting the layer with high energy ions, e.g. impurity ions or Si or Ge ions. Ge and Si ions with a dose of about $1\times10^{14}$ to $1\times10^{15}$ ions/cm$^2$ and with energies of about 5 to 100 keV may be used to guarantee amorphization and good short channel transistor scaling. The result is an amorphous Si-layer on top of a crystalline Si substrate. Later, the p and n dopants are added to the amorphous Si to form the p-channel and n-source/drain areas. By annealing the amorphous layer at temperatures of around 600° C., a short anneal time (~5 min) suffices to activate the dopants which are present in the amorphous Si.

In order to prevent deep S/D transistor punch-through, the amorphous layer depth needs to include not only the junction dopant profile but also the underneath halo profile. During the regrowth, junction and halo dopants will be highly activated and this will ensure good short channel transistor properties. The energy of the amorphous implant has to be carefully chosen to avoid dopant penetration through the metal gate stack.

The thermal budget for the SPER flow is limited to ensure minimal dopant diffusion. Conceptually, the anneal time is chosen to substantially crystallize the amorphised semiconductor. The exact thermal budget will depend upon the thickness to be crystallized and the rate of solid phase epitaxial regrowth. For undoped Si, the solid phase epitaxial regrowth rate is about $(3.68\times10^8 \text{ cm/s})\exp[-(2.76 \text{ eV})/k_BT]$, where $k_B$ is the Boltzmann constant and T is the absolute temperature, per G L Olson and J A Roth, Materials Science Reports 3, 1 (1988). As an example, at 600° C., the SPER rate is 26 nm/min, which means that it would take slightly less than 4 min to crystallize a 100 nm amorphous Si layer. At 550° C., the required time for the same 100 nm layer increases to ~40 min and at 650° C., the time drops to less than a minute. While the exact rate of SPER will vary with impurity concentration and crystal orientation, the concepts are the same.

One of the benefits of the SPER regrowth associated with deep Ge or Si pre-amorphization, is the high activation of junction and halo dopant below the junction profile ensuring good short channel transistor properties. A second benefit of the dopant activation by SPER over the more conventional hotter activation anneals is the much higher rate of dopant activation at a much lower thermal budget. At typical SPER temperatures for Si of about 550 to 750° C., the diffusion of dopants is very slow, so as to be essentially diffusionless during the typical anneal times. As the amorphous/crystalline interface moves past the dopant atom, the dopant is incorporated into substitutional sites in higher amount compared to the dopant solid solubility in Si. For this reason the dopant activation reached with SPER is named 'metastable'. Any additional thermal budget, after re-crystallization is completed, will induce dopant de-activation. In other words, the system will relax from a metastable activation state towards an activation limited by the dopant solid solubility in silicon. For conventional (non-SPER) activation in Si, a much higher temperature must be used for the dopant to go into electrically active sites, and furthermore, these high temperatures can lead to unwanted diffusion.

For germanium, the typical dopants are B and Ga for p-type and P, As, and Sb for n-type, see for example, D P Brunco et al, "Germanium: The Past and Possibly A Future Material for Microelectronics, ECS Trans 11 (4), 479 (2007). For Ge pMOS devices, B is typically used for extensions (aka lowly doped drains (LDD)) and for source/drain implants (aka highly doped drains (HDD)). At technologically relevant doses and conditions, B is essentially diffusionless and is well activated, even for temperatures as low as 400° C. Arsenic and/or phosphorus are used for wells, including implants known as deep well, shallow well, anti-punchthrough and $V_T$-adjust, as well as for halos. While the problem of high activation/minimal diffusion of n-type dopants for Ge has not been solved for high doses (>about $5\times10^{19}$ cm$^{-3}$), the required doses for wells are typically less than $\sim1\times10^8$ cm$^{-3}$ and for halos are typically less than about $2\times10^{19}$ cm$^{-3}$. At these concentrations, both P and As activate fairly well with essentially no diffusion at temperatures as low as about 550 or 600° C.

According to one embodiment, amorphization of Si is performed by implanting the Si active area, e.g. with Ge ions, while protecting the Ge active area so that the Ge active area is not influenced by the amorphization implant. Alternatively, the Ge active area is not protected and the amorphization implant is performed on the Ge area as well, leading additionally to amorphization of the Ge-areas. In that case, under the right annealing conditions, SPER-activation takes place not only in the Si area, but also in the Ge areas.

For estimation purposes, the following table shows the calculated SPER rates in Si and the estimated SPER anneal times for activating an undoped or lightly doped 00 nm amorphous Si layer. For highly doped layers, the growth rates may be different due to other influences. In one embodiment, activation annealing at temperatures between 600° C. and 900° C. allows dopant activation in times of less than 5 min.

| Temperature (° C.) | Si SPER Rate (nm/s) | Si SPER Rate (nm/min) | 100 nm time (min) | 100 nm time (sec) |
|---|---|---|---|---|
| 550 | 0.05 | 2.79 | 35.884 | 2153.018 |
| 575 | 0.15 | 8.77 | 11.397 | 683.813 |
| 600 | 0.43 | 25.87 | 3.865 | 231.927 |
| 625 | 1.20 | 71.82 | 1.392 | 83.542 |
| 650 | 3.14 | 188.66 | 0.530 | 31.804 |
| 675 | 7.85 | 470.96 | 0.212 | 12.740 |
| 700 | 18.69 | 1121.70 | 0.089 | 5.349 |
| 725 | 42.63 | 2557.95 | 0.039 | 2.346 |
| 750 | 93.38 | 5602.88 | 0.018 | 1.071 |
| 775 | 197.03 | 11821.89 | 0.008 | 0.508 |
| 800 | 401.52 | 24090.97 | 0.004 | 0.249 |
| 825 | 792.12 | 47527.47 | 0.002 | 0.126 |
| 850 | 1516.17 | 90970.06 | 0.001 | 0.066 |
| 875 | 2821.13 | 169267.51 | 0.001 | 0.035 |
| 900 | 5112.15 | 306729.19 | 0.000 | 0.020 |

For estimation purposes, the following table shows the calculated SPER rates in Ge and the estimated SPER anneal times for activating a 100 nm amorphous Ge layer. For undoped Ge, the SPER rate is estimated $(4.45 \times 10^{18}$ nm/min$) \exp[-(2.19 \, eV)/k_B T]$, where $k_B$ is the Boltzmann constant and T is the absolute temperature, per T E Haynes et al, Physical Review B 51, 7762 (1995). As can be seen, these rates are much higher than for Si such that any anneal time sufficient to crystallize the Si will also crystallize the Ge.

| Temperature (° C.) | Ge SPER Rate (nm/s) | Ge SPER Rate (nm/min) | 100 nm time (min) | 100 nm time (sec) |
|---|---|---|---|---|
| 500 | 23555.07 | 392.58 | 0.3 | 15 |
| 525 | 65954.67 | 1099.24 | 0.1 | 5.5 |
| 550 | 173478.28 | 2891.30 | 0.0 | 2.1 |
| 575 | 431007.61 | 7183.46 | 0.0 | 0.84 |
| 600 | 1016463.46 | 16941.06 | 0.0 | 0.35 |
| 625 | 2285365.07 | 38089.42 | 0.0 | 0.16 |
| 650 | 4917695.36 | 81961.59 | 0.0 | 0.073 |
| 675 | 10162893.46 | 169381.56 | 0.0 | 0.035 |
| 700 | 20233705.69 | 337228.43 | 0.0 | 0.018 |
| 725 | 38918210.93 | 648636.85 | 0.0 | 0.0093 |
| 750 | 72501637.26 | 1208360.62 | 0.0 | 0.0050 |
| 775 | 131115376.14 | 2185256.27 | 0.0 | 0.0027 |
| 800 | 230659365.50 | 3844322.76 | 0.0 | 0.0016 |
| 825 | 395474951.72 | 6591249.20 | 0.0 | 0.00091 |
| 850 | 661977390.08 | 11032956.50 | 0.0 | 0.00054 |
| 875 | 1083489032.76 | 18058150.55 | 0.0 | 0.00033 |
| 900 | 1736544568.79 | 28942409.48 | 0.0 | 0.00021 |

Certain Embodiments of Processes

The following table provides an overview of the processes according to certain embodiments of the invention, with some comments or alternatives in the right hand column. The invention is not limited by this exemplary process flow. These embodiments are characterized only by the presence of an amorphization process, and by the activation anneal under SPER-conditions.

| Process | Comment |
|---|---|
| Start with bulk Si wafer | Silicon-on-Insulator (SOI) is another option. |
| Process to STI (Shallow Trench Isolation) to obtain $SiO_2$ isolation areas | Standard processing |
| Provide an $SiO_2$ layer on Si in the nMOS active areas | A thin layer of 1 to 150 nm is sufficient to prevent etching of the Si in the subsequent process to form the Ge areas 3. This $SiO_2$ layer may be comprised of the pad oxide used during the STI process or may be formed by a thermal or chemical oxidation of the Si. |
| Litho/Etch/Strip | Remove the thin $SiO_2$ layer from the pMOS areas, e.g. by a wet or dry etch. |
| Etch Si in pMOS areas. Selectively deposit epi Ge in etched Si areas | It is also possible to deposit a relaxed SiGe buffer layer prior to the Ge layer to reduce dislocation densities and/or to allow a strained Ge layer for further performance enhancement. |
| Post Ge epi treatments to reduce dislocation densities and improve topography | Can be done by anneal (e.g., 800-900° C.) and Ge CMP (Chemical Mechanical Polishing). Optionally, can recess Ge after CMP to be below the plane of the top of the STI $SiO_2$. |
| Litho/Etch/Strip | Remove the thin $SiO_2$ layer from the nMOS areas, e.g. by a dry etch. Alternatively, this thin $SiO_2$ is removed during the above CMP such that this Litho/Etch/Strip module is unnecessary. |
| Patterned well implants separate for Si nMOS and Ge pMOS | Conceptually, this is similar to that for Si-based technologies, but with pMOS implants selected for Ge. |
| Gate stack formation | According to standard processing, but must be compatible with both Si and Ge. |

| Process | Comment |
| --- | --- |
| Gate etch | According to standard processing. The final etch process should have selectivity to both Si and Ge. |
| Formation of amorphous layer for nMOS (or nMOS and pMOS) | Si amorphization implants with doses and energies required to form an amorphous layer with a depth of between 10 and 150 nm. Implant can be in Si nMOS region only, or optionally also in Ge pMOS |
| Formation of halo and extensions for nMOS | Note: nMOS implants are indicated first in this table, but order can optionally be pMOS first. According to standard processing for halo implantation. Extension implantations with Ar or P and with energy and dose such as to get a junction profile with a depth of between 5 and 100 nm. |
| Formation of halo and extensions for pMOS | According to standard processing for halo implantation. Extension implantations with B or Ga and with energy and dose such as to get a junction profile with a depth of between 5 and 100 nm. |
| Formation of spacers | According to standard processing. If needed, a dual spacer may be employed to optimize for Ge pMOS and Si nMOS |
| Formation of HDDs (Highly Doped Drain regions) | Separate for Si nMOS and Ge pMOS as is standard for all CMOS. |
| Activation anneal | The same thermal treatment is used for dopant activation in Si nMOS and Ge pMOS. Temperatures may be between 500 and 900° C., with typical temperatures between 550 and 700° C. Times are temperature dependent, with shorter times required for higher temperatures, e.g. ~10 s at 700° C. and longer times for lower temperatures, e.g. ~40 min at 550° C. |
| Silicide/Germanide of source/drains and possibly for poly-Si(Ge) gates | According to standard process flow. |
| Contacts and metallization. | According to standard processing. |
| Sinter/hydrogen passivation of dangling bonds in gate stack | According to standard processing. Some fine tuning of time and temperature may be needed to optimize for both Si and Ge. |

CONCLUSION

In one of the foregoing embodiments, the method relates to the use of a single activation anneal that serves for both Si nMOS and Ge pMOS. By use of a solid phase epitaxial regrowth (SPER) process for the Si nMOS, the thermal budget for the Si nMOS can be lowered to be compatible with Ge pMOS. Activation of Ge n-type dopants and reasonable SPER rates for Si provide a practical lower limit on temperature of about 500° C. and the melting of Ge provides an upper limit of about 937° C. According to one embodiment, an activation anneal temperature is applied between about 500 and 900° C., more preferably between 550 and 700° C. Within these temperature ranges, times that are sufficient to crystallize the Si are sufficient to activate the dopants in Ge.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of producing one or more nMOSFET devices and one or more pMOSFET devices on the same semiconductor substrate, the method comprising:

forming a first gate on a crystalline Si active area and a second gate on a crystalline Ge active area on a substrate, the Si active area being separate from the Ge active area;

forming an amorphous Si layer on top of a crystalline Si layer in the crystalline Si active area;

implanting the Ge and Si areas with dopants so as to form source and drain regions; and activating the dopants in the amorphous Si layer and the Ge area simultaneously by annealing the substrate at a temperature and during a time interval suitable for obtaining solid phase epitaxial regrowth of the amorphous Si layer, wherein the amorphous Si layer is formed by subjecting the crystalline Si active area to an amorphization process, wherein the amorphization process comprises implanting the Si active area with Si ions, Ge ions, or impurity ions, wherein the Ge active area is also implanted with the ions in the process of implanting the Si active area so as to form an amorphous Ge layer on top of a crystalline Ge layer.

2. The method according to claim 1, wherein the amorphous Si layer is formed by subjecting the crystalline Si active area to an amorphization process.

3. The method according to claim 2, wherein the amorphization process comprises implanting the Si active area with Si ions, Ge ions, or impurity ions.

4. The method according to claim 1, wherein the activation of the dopants takes place at a temperature between about 500° C. and 900° C.

5. The method according to claim 4, wherein the activation of the dopants takes place at a temperature between about 550° C. and 700° C.

6. The method according to claim 4, wherein the activation of the dopants takes place at a temperature between about 600° C. and 900° C., and during a time interval of less than about 5 minutes.

7. The method according to claim 1, wherein the Si active area comprises one or more layers of $Si_xGe_{1-x}$, with x>80%.

8. The method according to claim 1, wherein the Ge active area comprises one or more layers of $Si_yGe_{1-y}$, with y<20%.

9. The method according to claim 1, wherein the active areas are separated by at least one insulator area.

10. The method according to claim 1, further comprising forming a first channel in the Si and a second channel in the Ge active area, the channels being of a length lower than about 0.5 μm.

11. A semiconductor device comprising a nMOSFET device and a pMOSFET device on the same semiconductor substrate, the device being formed by the method according to claim 1.

12. A method of producing one or more nMOSFET devices and one or more pMOSFET devices on the same semiconductor substrate, the method comprising:
  forming a crystalline Si active area and a crystalline Ge active area on a substrate;
  forming an amorphous Si layer on top of a crystalline Si layer in the crystalline Si active area;
  implanting the Ge and Si areas with dopants so as to form source and drain regions; and
  annealing the substrate at a temperature and during a time interval suitable for obtaining solid phase epitaxial regrowth of the amorphous Si layer so as to activate the dopants in the amorphous Si layer and the Ge area simultaneously,
  wherein the amorphous Si layer is formed by subjecting the crystalline Si active area to an amorphization process, wherein the amorphization process comprises implanting the Si active area with Si ions, Ge ions, or impurity ions, wherein the Ge active area is also implanted with the ions in the process of implanting the Si active area so as to form an amorphous Ge layer on top of a crystalline Ge layer.

13. The method according to claim 12, wherein the amorphous Si layer is formed by subjecting the crystalline Si active area to an amorphization process.

14. The method according to claim 13, wherein the amorphization process comprises implanting the Si active area with Si ions, Ge ions, or impurity ions.

15. The method according to claim 12, wherein the Si active area comprises one or more layers of $Si_xGe_{1-x}$, with x>80%.

16. The method according to claim 12, wherein the Ge active area comprises one or more layers of $Si_yGe_{1-y}$, with y<20%.

17. The method according to claim 12, further comprising forming a first channel in the Si and a second channel in the Ge active area, the channels being of a length lower than about 0.5 μm.

18. A semiconductor device comprising a nMOSFET device and a pMOSFET device on the same semiconductor substrate, the device being formed by the method according to claim 12.

* * * * *